(12) United States Patent
Lee et al.

(10) Patent No.: US 11,121,187 B2
(45) Date of Patent: Sep. 14, 2021

(54) ORGANIC LIGHT EMITTING DIODE DISPLAY

(71) Applicant: Samsung Display Co., Ltd., Yongin-Si (KR)

(72) Inventors: Hyeon Bum Lee, Hwaseong-si (KR); Jin Ho Ju, Seoul (KR)

(73) Assignee: Samsung Display Co., Ltd.

( * ) Notice: Subject to any disclaimer, the term of this patent is extended or adjusted under 35 U.S.C. 154(b) by 235 days.

(21) Appl. No.: 16/383,506

(22) Filed: Apr. 12, 2019

(65) Prior Publication Data

US 2020/0091247 A1 Mar. 19, 2020

(30) Foreign Application Priority Data

Sep. 14, 2018 (KR) .................... 10-2018-0110444

(51) Int. Cl.
| | |
|---|---|
| H01L 27/32 | (2006.01) |
| H01L 51/00 | (2006.01) |
| G06F 3/041 | (2006.01) |
| G06F 3/044 | (2006.01) |

(52) U.S. Cl.
CPC ............ *H01L 27/322* (2013.01); *G06F 3/044* (2013.01); *G06F 3/0412* (2013.01); *G06F 3/0416* (2013.01); *H01L 27/323* (2013.01); *H01L 27/3244* (2013.01); *H01L 51/0097* (2013.01); *H01L 2251/301* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2016/0238901 A1* | 8/2016 | Mizuno | ............. G02F 1/136209 |
| 2018/0182814 A1* | 6/2018 | Kim | ...................... H01L 27/322 |
| 2018/0321764 A1* | 11/2018 | Oh | ...................... H01L 51/5253 |

FOREIGN PATENT DOCUMENTS

| | | |
|---|---|---|
| KR | 10-0742372 B1 | 7/2007 |
| KR | 10-2014-0087842 A | 7/2014 |
| KR | 10-1634791 B1 | 6/2016 |

(Continued)

*Primary Examiner* — Amare Mengistu
*Assistant Examiner* — Sarvesh J Nadkarni
(74) *Attorney, Agent, or Firm* — Innovation Counsel LLP

(57) ABSTRACT

An OLED display according to an exemplary embodiment includes: a substrate that includes a display area and a non-display area; a pixel circuit that is disposed in the display area; organic light emitting diodes and barrier ribs that are disposed on the pixel circuit; an encapsulation layer that covers the pixel circuit, the organic light emitting diodes, and the barrier ribs; and a color filter that is disposed on the encapsulation layer, wherein the encapsulation layer comprises an edge area that is adjacent to the non-display area in the display area and a center area not directly adjacent to the non-display area and having the edge area disposed therebetween, the color filter comprises a first color filter, a second color filter, a third color filter, and color filter overlapped portions where the first color filter, the second color filter, and the third color filter are overlapped, and the color filter overlapped portions are disposed in areas where the barrier ribs are disposed, and a thickness of the color filter is greater in the edge area than in the center area.

20 Claims, 12 Drawing Sheets

(56) References Cited

FOREIGN PATENT DOCUMENTS

| KR | 10-2018-0034232 A | 4/2018 |
| KR | 10-1853027 B1 | 4/2018 |
| KR | 10-1853037 B1 | 4/2018 |

\* cited by examiner

ORGANIC LIGHT EMITTING DIODE DISPLAY

CROSS-REFERENCE TO RELATED APPLICATION

This application claims priority to and the benefit of Korean Patent Application No. 10-2018-0110444 filed in the Korean Intellectual Property Office on Sep. 14, 2018, the entire contents of which are incorporated herein by reference.

BACKGROUND

(a) Field

The present inventive concept relates to an organic light emitting diode (OLED) display.

(b) Description of the Related Art

An organic light emitting diode display includes two electrodes and an organic emission layer positioned therebetween, and an electron injected from a cathode and a hole injected from an anode are coupled with each other in the organic emission layer to generate an exciton, and light is emitted by the emitting energy of the exciton.

Recently, a flexible organic light emitting diode (OLED) display using a substrate which is light, strong against impact, flexible, and easy to deform has been developed. The flexible OLED display is attracting attention as a next-generation display device that can be used for a TV, a computer monitor, a portable device, a wearable device, and the like.

Such an OLED display may further include a touch sense function that can mutually interact with a user, in addition to a function for displaying an image. When a user touches a finger, a touch pen, or the like on the screen, the touch sense function senses a change in pressure, charge, light, and the like applied to the screen to determine touch information, such as whether an object is touched on the screen, as well as a touch location. The OLED display may receive an image signal based on the touch information.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments have been made in an effort to provide an OLED display of which an optical characteristic is uniform throughout the entire viewing area, and that is capable of realizing high resolution.

An OLED display according to an exemplary embodiment includes: a substrate that includes a display area and a non-display area; a pixel circuit that is disposed in the display area; organic light emitting diodes and barrier ribs that are disposed on the pixel circuit; an encapsulation layer that covers the pixel circuit, the organic light emitting diodes, and the barrier ribs; and a color filter that is disposed on the encapsulation layer, wherein the encapsulation layer comprises an edge area that is adjacent to the non-display area in the display area and a center area that is not directly adjacent to the non-display area and having the edge area disposed therebetween, the color filter comprises a first color filter, a second color filter, a third color filter, and color filter overlapped portions where the first color filter, the second color filter, and the third color filter are overlapped, and the color filter overlapped portions are disposed in areas where the barrier ribs are disposed, and a thickness of the color filter is greater in the edge area than in the center area.

The organic light emitting diode may include an organic emission layer, and a difference between a distance from the top surface of the organic emission layer to the topmost portion of the overlapped portion of the color filter in the center area and a distance from the top surface of the organic emission layer to the topmost portion of the overlapped portion of the color filter in the edge area may be less than 7% of the distance from the top surface of the organic emission layer to the topmost portion of the overlapped portion of the color filter in the center area.

A thickness of the encapsulation layer in the center area may be greater than a thickness of the encapsulation layer in the edge area.

The edge area surrounds the center area, and a thickness of the encapsulation layer in the edge area may be less than 90% of a maximum thickness of the encapsulation layer in the center area.

The first color filter, the second color filter, and the third color filter may be respectively a red color filter, a green color filter, and a blue color filter.

The first color filter, the second color filter, and the third color filter may be respectively a magenta color filter, a yellow color filter, and a cyan color filter.

An OLED display according to an exemplary embodiment includes: a substrate that includes a display area and a non-display area; a pixel circuit that is disposed on the display area; organic light emitting diodes and barrier ribs that are disposed on the pixel circuit; an encapsulation layer that covers the pixel circuit, the organic light emitting diodes, and the barrier ribs; a touch sense layer that is disposed on the encapsulation layer; and a color filter that is disposed on the touch sense layer, wherein the encapsulation layer includes an edge area that is adjacent to the non-display area in the display area and a center area not directly adjacent to the non-display area and having the edge area disposed therebetween, the touch sense layer comprises a planarization layer and a touch electrode, a thickness of the planarization layer is greater in the edge area than in the center area, and the color filter comprises a first color filter, a second color filter, a third color filter, and color filter overlapped portions where the first color filter, the second color filter, and the third color filter are overlapped.

The color filter overlapped portions may be disposed in areas that correspond to the barrier ribs.

The first color filter, the second color filter, and the third color filter may be respectively a red color filter, a green color filter, and a blue color filter.

The organic light emitting diode may include an organic emission layer, and a difference between a distance from the top surface of the organic emission layer to the topmost portion of the overlapped portion of the color filter in the center area and a distance from the top surface of the organic emission layer to the topmost portion of the overlapped portion of the color filter in the edge area may be less than 7% of the distance from the top surface of the organic emission layer to the topmost portion of the overlapped portion of the color filter in the center area.

The touch sense layer may further include an inorganic insulation layer, the touch electrode may include a first touch electrode and a second touch electrode, and the first touch electrode and second touch electrode each may include a plurality of unit electrode lines.

The first touch electrode may include a plurality of first touch cells arranged along a first direction and a plurality of first connection portions that connect the plurality of first touch cells, and the second touch electrode may include a plurality of second touch cells arranged along a second direction that crosses the first direction and second connection portions that connect the second touch cells.

The first connection portions may be disposed on the encapsulation layer, the planarization layer and the inorganic insulation layer may be sequentially disposed on the first connection portion, the first touch cells, the second touch cells, and the second connection portions may be disposed on the inorganic insulation layer, and the first touch cells are also disposed in openings that are formed in the planarization layer and the inorganic insulation layer such that they are connected with the first connection portions.

The first touch electrode may receive a first touch signal for sensing a coordinate value in the second direction, and the second touch electrode may receive a second touch signal for sensing a coordinate value in the first direction.

The planarization layer may include an organic material, and the inorganic insulation layer may include a silicon nitride (SiNx) or a silicon oxide ($SiO_x$).

A thickness of the encapsulation layer may be greater in the center area than in the edge area.

The touch sense layer may further include: an inorganic insulation layer that is disposed on the planarization layer; and wires that are connected with the touch electrodes, wherein the touch electrodes may be disposed on the inorganic insulation layer, and the touch electrodes may include a plurality of unit electrode lines.

The planarization layer may include an organic material, and the inorganic insulation layer may include a silicon nitride (SiNx) or a silicon oxide ($SiO_x$).

An OLED display according to an exemplary embodiment includes: a substrate that includes a display area and a non-display area; a pixel circuit that is disposed on the display area; organic light emitting diodes and barrier ribs that are disposed on the pixel circuit; an encapsulation layer that covers the pixel circuit, the organic light emitting diodes, and the barrier ribs; and a color filter that is disposed on the encapsulation layer, wherein the encapsulation layer includes an edge area that is adjacent to the non-display area in the display area and a center area not directly adjacent to the non-display area and having the edge area disposed therebetween, the color filter includes a first color filter, a second color filter, and a third color filter, and color filter overlapped portions where the first color filter, the second color filter, and the third color filter are overlapped, and the color filter overlapped portions are disposed in areas where the barrier ribs are disposed, and a difference between a distance from the substrate to the top surface of the color filter overlapped portion in the center area and a distance from the substrate to the top surface of the color filter overlapped portion in the edge area is less than 5% of the distance from the substrate to the top surface of the color filter overlapped portion in the center area.

A height of the top surface of the encapsulation layer in the center area may be uniform, and may be gradually lowered in the edge area.

According to the exemplary embodiments, an OLED display that can realize high-resolution and has a uniform optical characteristic throughout the entire area can be provided.

DETAILED DESCRIPTION OF THE EMBODIMENTS

Figure 1:
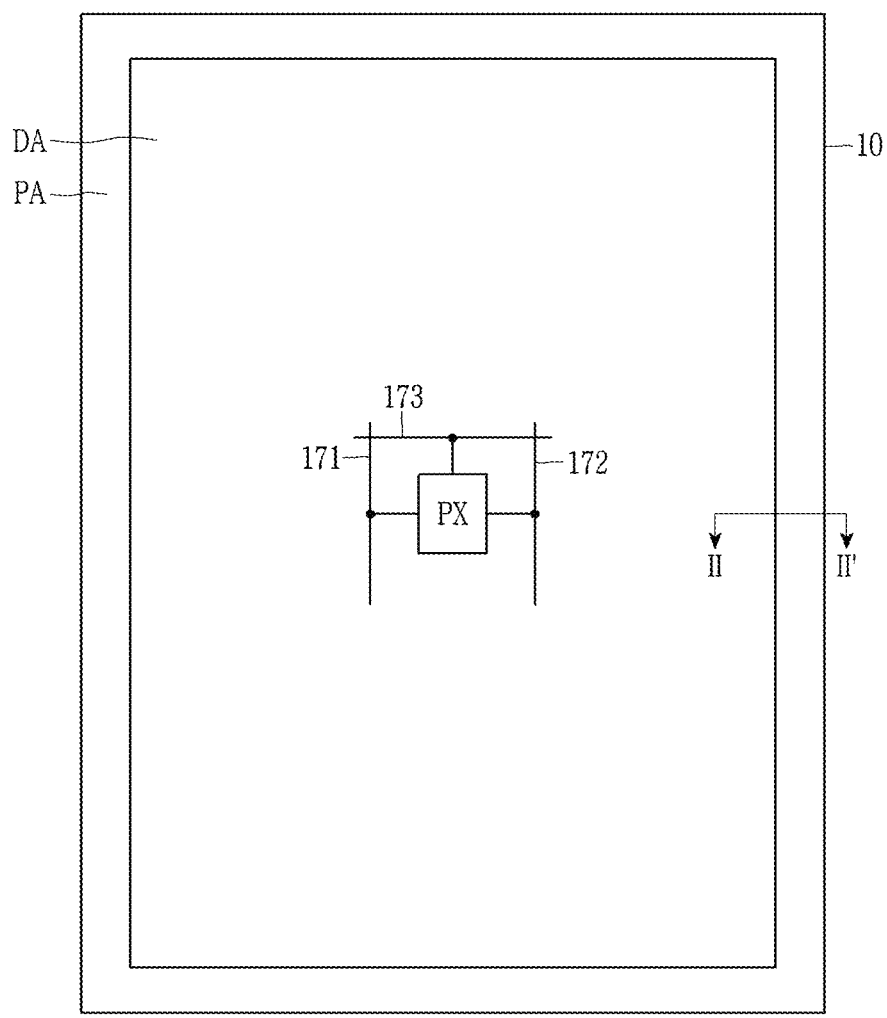
FIG. 1 is a schematic layout view of an OLED display according to an exemplary embodiment of the present inventive concept.

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present inventive concept.

The drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present inventive concept is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element means positioned above or below the target element, and does not necessarily mean positioned "at an upper side" based on a gravity direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Referring to FIG. 1 to FIG. 4, an organic light emitting diode (OLED) display according to an exemplary embodiment will be described.

Figure 2:
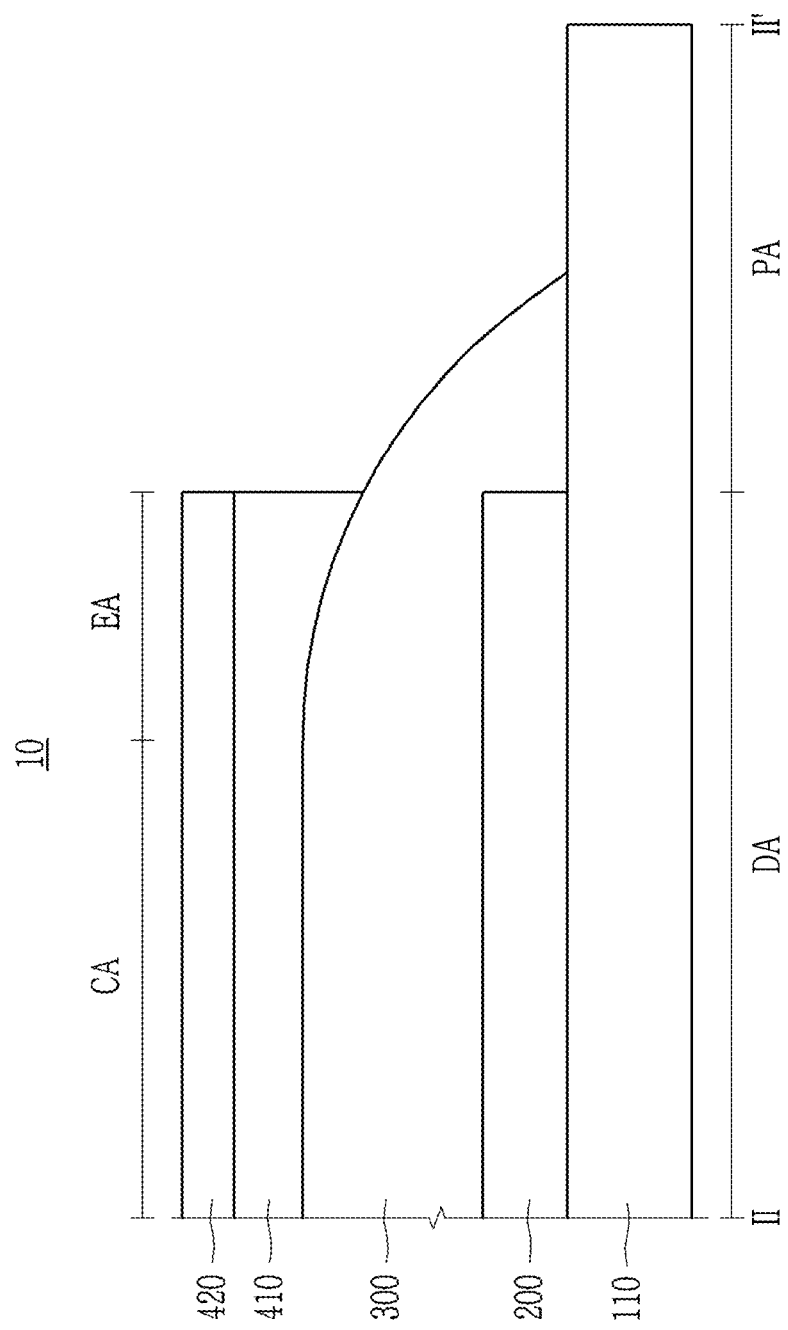
FIG. 2 is a schematic cross-sectional view of the OLED display, taken along the line II-II' of FIG. 1.

FIG. 1 is a schematic layout view of an OLED display according to an exemplary embodiment of the present inventive concept. FIG. 2 is a schematic cross-sectional view of the OLED display of FIG. 1, taken along the line II-II'.

Referring to FIG. 1, an OLED display includes a display panel 10. The display panel 10 includes a display area DA and a non-display area PA. The display area DA is an area where a plurality of pixels PX are formed, and displays an image. In the display area DA, a plurality of signal lines that include a plurality of gate lines 173, a plurality of data lines 171, and a plurality of driving voltage lines 172 are formed. The non-display area PA is an area where elements or wires that generate or transmit various signals applied to the display area DA are disposed.

Referring to FIG. 2, the display panel 10 includes a substrate 110, a display layer 200, an encapsulation layer 300, a color filter 410, and an overcoat layer 420.

The substrate 110 may include a flexible material that can be bendable, foldable, rollable, and the like, such as plastic and the like. For example, the substrate 110 may include polyimide (PI), polyethylene naphthalate (PEN), polycarbonate (PC), polyarylate (PAR), polyether imide (PEI), polyether sulfone (PES), and the like. The substrate 110 is also divided into the display area DA and the non-display area PA.

The display layer 200 is disposed on the display area DA of the substrate 110. The display layer 200 includes a pixel circuit that includes at least one thin film transistor, an organic light emitting element of which light emission is controlled by the pixel circuit, and a barrier rib that partitions an emission area. Depending on exemplary embodiments, the display layer 200 may further include a touch sense layer (not shown) for sensing a touch, and the touch sense layer may be disposed above or below the organic light emitting element.

The encapsulation layer 300 is disposed on the display layer 200 to cover the display layer 200. The encapsulation layer 300 may seal the display layer 200 by covering not only the top surface of the display layer 200 but also side surfaces of the display layer 200. Since the organic light emitting element is weak to moisture and oxygen, the encapsulation layer 300 blocks introduction of external moisture and oxygen by sealing the display layer 200. The encapsulation layer 300 includes a plurality of layers, and may be formed of a composite layer including both an inorganic layer and an organic layer, or formed of a triple layer in which an inorganic layer, an organic layer, and an inorganic layer are sequentially stacked. Here, the inorganic layer may include at least one of a metal oxide, a metal oxynitride, a silicon oxide, a silicon nitride, and a silicon oxynitride, and the organic layer may be formed of a polymer-based material, but this is not restrictive.

The encapsulation layer 300 is disposed in the entire display area DA, and extends from the display area DA such that an end of the encapsulation layer 300 may be disposed in the non-display area PA. On a plane, the encapsulation layer 300 includes a center area CA that is disposed at a center of the encapsulation layer in the display area DA and an edge area EA that is disposed at an edge of the encapsulation layer 300 in the display area DA. The edge area EA of the encapsulation layer 300 is disposed in an area of the display area DA that contacts and/or is directly adjacent to the non-display area PA, and the center area CA is disposed at a distance from the non-display area PA, while interposing the edge area EA therebetween. The edge area EA may be disposed in an area that surrounds the center area CA, that is, the edge area EA may be disposed at the periphery of the center area CA.

In the center area CA, the encapsulation layer 300 has a substantially flat upper surface. That is, the encapsulation layer 300 may have a uniform thickness in the entire area of the center area CA, and a distance from the substrate 110 to the top surface of the encapsulation layer 300 may be uniform. Hereinafter, a thickness of the encapsulation layer 300 in the center area CA is called a first thickness. For example, the first thickness may be about 8 μm to about 9 μm. However, this is an example, and the thickness of the encapsulation layer 300 is not limited thereto.

In the edge area EA, the thickness of the encapsulation layer 300 is gradually reduced. The edge area EA may be an area where the thickness of the encapsulation layer 300 is 90% or less compared to the maximum thickness in the center area CA. For example, the edge area EA may be about 3.5 mm to 4.5 mm in length from an end of the display layer 200. That is, the edge area EA may be disposed along the edge of the display layer 200, and a width of the edge area EA may be about 3.5 mm to 4.5 mm. Hereinafter, a thickness of the encapsulation layer 300 at the edge area EA is called a second thickness. The second thickness of the encapsulation layer 300 is gradually reduced toward the end of the encapsulation layer, and accordingly, the top of the encapsulation layer 300 is gradually lowered in the edge area EA of the display area DA. The top surface of the encapsulation layer 300 is curved and thus inclined in the edge area EA. In the edge area EA, the top surface of the encapsulation layer 300 may be curved, but is not limited thereto. The second thickness of the encapsulation layer 300 is smaller than the first thickness. For example, a maximum thickness of the second thickness of the encapsulation layer 300 in the edge area EA may be less than 8 μm.

The top surface of the encapsulation layer 300 meets a plane of the substrate 110 at the edge of the encapsulation layer 300, and the top surface of the encapsulation layer 300 may form an acute angle with the bottom surface of the encapsulation layer 300 at the portion where the top surface of the encapsulation layer 300 meets the plane of the substrate 110. The top surface of the encapsulation layer 300 may have a shape that is inclined from the edge area EA to the end thereof, and may be curved.

The color filter 410 is disposed on the encapsulation layer 300. The color filter 410 suppresses reflection of external light, and minimizes loss of light discharged to the outside. In addition, since the color filter 410 transmits light only having a wavelength band of an emitted color, a desired color can be more vividly realized.

In the OLED display according to the exemplary embodiment, a thickness of the color filter 410 is gradually increased toward the end thereof. Thus, the thickness of the color filter 410 in the edge area EA is greater than the thickness in the center area CA. In addition, the thickness of the color filter 410 may be gradually increased toward the end of the display area DA in the edge area EA. Since the top surface of the encapsulation layer 300 is gradually lowered toward the edge in the edge area EA, the bottom surface of the color filter 410 is also gradually lowered toward the end of the color filter 410. As the bottom surface of the color filter 410 is lowered, the thickness of the color filter 410 is increased, thereby compensating a step difference. Accordingly, a distance from the substrate 110 or the display layer 200 to the top surface of the color filter 410 is almost uniform not only in the center area CA of the display area DA but also in the edge area EA. For example, a difference between a distance from the substrate 110 or the display layer 200 to the top surface of the color filter 410 in the center area CA and a distance from the substrate 110 or the display layer 200 to the top surface of the color filter 410 in the edge area EA may be less than 5% of a distance from the substrate 110 or the display layer 200 to the top surface of the color filter 410 in the center area CA.

The overcoat layer 420 is disposed on the color filter 410. The overcoat layer 420 is formed on the color filter 410 to protect the color filter 410, and planarizes a surface of a layer where the color filter 410 is formed.

The overcoat layer 420 may include an organic insulation layer. The organic insulation layer may include a general purpose polymer (e.g., poly(methyl methacrylate) (PMMA) and polystyrene (PS)), a polymer derivative having a phenol group, an acrylic polymer, an imide polymer, an aryl ether polymer, an amide polymer, a fluorine polymer, a p-xylene polymer, a vinyl alcohol-based polymer, or a blend thereof. The overcoat layer 420 may be provided as a compositely stacked body of an inorganic insulation layer and an organic insulation layer. The inorganic insulation layer may include at least one of $SiO_2$, SiNx, SiON, $Al_2O_3$, $TiO_2$, $Ta_2O_5$, $HfO_2$, $ZrO_2$, BST, PZT, and the like.

Figure 3:
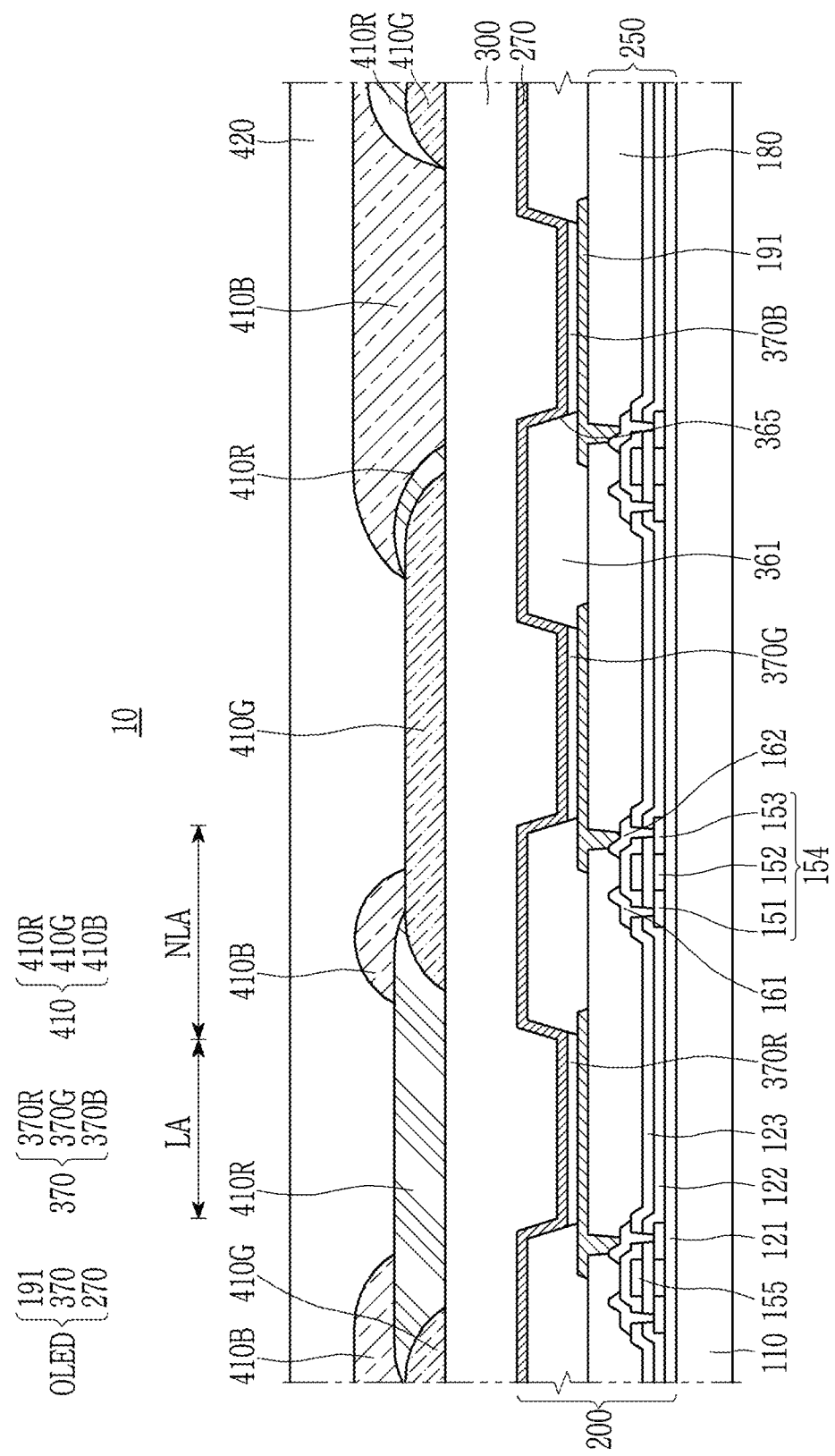
FIG. 3 is a cross-sectional view of the OLED display of FIG. 1 and FIG. 2 in a center area.

FIG. 3 is a cross-sectional view of a center area CA of an OLED display according to an exemplary embodiment.

Referring to FIG. 3, an OLED display according to an exemplary embodiment includes a substrate 110, a pixel circuit 250, an organic light emitting diode (OLED), a barrier rib 361, an encapsulation layer 300, a color filter 410, and an overcoat layer 420. The substrate 110 may include a flexible material that can be bendable, foldable, or rollable, such as plastic. A detailed description is the same as the above-stated description referring FIG. 2, and therefore will be omitted.

A buffer layer 121 is disposed on the substrate 110. The buffer layer 121 may include a silicon nitride (SiNx) or a silicon oxide ($SiO_x$). The buffer layer 121 is disposed between the substrate 110 and a semiconductor layer 154, and improves a characteristic of polysilicon by blocking an impurity from the substrate 110 during a crystallization process for forming polysilicon, and a stress of the semiconductor layer 154 formed on the buffer layer 121 can be relieved by planarizing the substrate 110.

The semiconductor layer 154 is disposed on the buffer layer 121. The semiconductor layer 154 may be formed of polysilicon or an oxide semiconductor.

The semiconductor layer 154 may be formed of polysilicon, and includes a channel region 152, a source region 151, and a drain region 153. The source region 151 and the drain region 153 are respectively disposed at opposite sides of the channel region 152. The channel region 152 is an intrinsic semiconductor where an impurity is not doped, and the source region 151 and the drain region 153 are impurity semiconductors where a conductive impurity is doped. The semiconductor layer 154 may be formed of an oxide semiconductor, and in this case, an additional passivation layer may be added to protect the oxide semiconductor, which is weak to an external environment.

A gate insulation layer 122 is disposed on the semiconductor layer 154 to cover it. The gate insulating layer 122 may be a single layer or a multiple layer including at least one of a silicon nitride (SiNx) and a silicon oxide ($SiO_x$).

A gate electrode 155 is disposed on the gate insulating layer 122. The gate electrode 155 may be a multiple layer where a metal layer that includes one of copper (Cu), a copper alloy, aluminum (Al), an aluminum alloy, molybdenum (Mo), and a molybdenum alloy is stacked.

An interlayer insulation layer 123 is disposed on the gate electrode 155 and the gate insulation layer 122. The interlayer insulation layer 123 may include a silicon nitride (SiNx) or a silicon oxide ($SiO_x$). Openings that respectively expose the source region 151 and the drain region 15 are formed in the interlayer insulation layer 123.

A source electrode 161 and a drain electrode 162 are formed on the interlayer insulation layer 123. The source electrode 161 and the drain electrode 162 are respectively connected with the source region 151 and the drain region 153 of the semiconductor layer 154 through openings formed in the interlayer insulation layer 123 and the gate insulation layer 122.

A passivation layer 180 is disposed on the interlayer insulation layer 123, the source electrode 161, and the drain electrode 162. The passivation layer 180 planarizes the interlayer insulating layer 123, the source electrode 161, and the drain electrode 162 by covering them, and accordingly, a pixel electrode 191 can be formed on the passivation layer 180 without having a step difference. The passivation layer 180 may be formed of an organic material such as a polyacrylate resin, a polyimide resin, and the like, or formed of a stacked layer of an organic material and an inorganic material.

The pixel electrode 191 is disposed on the passivation layer 180. The pixel electrode 191 is connected with the drain electrode 162 through an opening formed in the passivation layer 180.

A driving transistor formed of the gate electrode 155, the semiconductor layer 154, the source electrode 161, and the drain electrode 162 is connected to the pixel electrode 191 and thus supplies a driving current to the organic light emitting diode OLED. The OLED display according to the present exemplary embodiment may further include a switching transistor (not shown) that is connected with a data line and transmits a data voltage in response to a scan signal and a compensation transistor (not shown) that is connected with the driving transistor and compensates a threshold voltage of the driving transistor in response to the scan signal, in addition to the driving transistor shown in FIG. 3.

The barrier rib 361 is disposed on and covering the passivation layer 180 and the pixel electrode 191, and the barrier rib 361 includes a pixel opening 365 that exposes the pixel electrode 191. The barrier rib 361 may include an organic material such as a polyacrylate resin, a polyimide resin, and the like, or a silica-based inorganic material. The pixel opening 365 may be formed in the shape of a rhombus on a plane, but is not limited thereto. The pixel opening 365 may have any shape such as a rectangle, a polygon, and the like.

An organic emission layer 370 is disposed on a portion of the pixel electrode 191, exposed by the pixel opening 365. The organic emission layer 370 may be formed of a low molecule organic material or a high molecule organic material such as poly(3,4-ethylenedioxythiophene) (PEDOT). In addition, the organic emission layer 370 may be a multiple layer that includes one or more of a hole injection layer (HIL), a hole transport layer (HTL), an electron transport layer (ETL), and an electron injection layer (EIL).

The organic emission layer 370 includes a red organic emission layer 370R emitting red light, a green organic emission layer 370G emitting green light, and a blue organic emission layer 370B emitting blue light. The red organic emission layer 370R, the green organic emission layer 370G, and the blue organic emission layer 370B are respectively formed in a red pixel, a green pixel, and a blue pixel for realization of a color image. The organic emission layer 370 include the red organic emission layer 370R, the green organic emission layer 370G, and the blue organic emission layer 370B, but the organic emission layer 370 may also emit light of magenta, light of yellow, and light of cyan.

A common electrode 270 is disposed on the organic emission layer 370. The common electrode 270 may be disposed over the plurality of pixels. The pixel electrode 191, the organic emission layer 370, and the common electrode 270 may form an organic light emitting diode OLED.

Here, the pixel electrode 191 may be an anode, which is a hole injection electrode, and the common electrode 270 may be a cathode, which is an electron injection electrode. However, the exemplary embodiment of the present inventive concept is not limited thereto, and the pixel electrode 191 may be a cathode and the common electrode 270 may be an anode depending on a driving method of the OLED display. Holes and electrons electrodes are respectively injected into the organic emission layer 370 from the pixel electrode 191 and the common electrode 270, and an exciton generated by coupling the injected hole and electron falls from an excited state to a ground state to emit light.

Accordingly, the display panel 10 includes an emission area LA where the organic emission layer 370 is disposed and thus emits light, and a non-emission area NLA where the barrier rib 361 is disposed and thus light is not emitted.

An encapsulation layer 300 is disposed on the common electrode 270. The encapsulation layer 300 shown in FIG. 3 is disposed in a center area CA, and thus has a uniform thickness. That is, a distance from the substrate 110 to a top surface of the encapsulation layer 300 is uniform. The encapsulation layer 300 is the same as the encapsulation layer 200 of FIG. 2, and thus no further detailed description will be provided.

A color filter 410 is disposed on the encapsulation layer 300. The color filter 410 includes a red color filter 410R, a green color filter 410G, and a blue color filter 410B. The red color filter 410R transmits light of a wavelength in a red region, the green color filter 410G transmits light of a wavelength in a green region, and the blue color filter 410B transmits light of a wavelength in a blue region. The color filter 410 is formed to correspond to the emission area LA, and extends to its neighboring non-emission area NLA.

When the color filter 410 is formed, the green color filter 410G, the red color filter 410R, and the blue color filter 410B are sequentially formed in that order. The green color filter 410G is disposed in the emission area LA that corresponds to the green organic emission layer 370G, and extends to the non-emission area NLA that neighbors the green organic emission layer 370G. The green color filter 410G is disposed in a portion of the non-emission area NLA, which is disposed between the red organic emission layer 370R and the blue organic emission layer 370B. In this case, the green color filter 410G is not disposed in a portion of the emission layer LA, which corresponds to the red organic emission layer 370R, or in a portion of the emission area LA, which corresponds to the blue organic emission layer 370B.

The red color filter 410R is disposed in a portion of the emission area LA, which corresponds to the red organic emission layer 370R, and extends to the non-emission area NLA that neighbors the red organic emission layer 370R, thereby overlapping the green color filter 410G. The red color filter 410R is also disposed in a portion of the non-emission area NLA, which is disposed between the green organic emission layer 370G and the blue organic emission layer 370B. In this case, the red color filter 410R is not disposed in a portion of the emission area LA, which corresponds to the green organic emission layer 370G or corresponds to the blue organic emission layer 370B.

The blue color filter 410B is disposed in a portion of the emission area LA, which corresponds to the blue organic emission layer 370B, and extends to the non-emission area NLA that neighbors the blue organic emission layer 370B, thereby overlapping the red color filter 410R. The blue color filter 410B is also disposed in the non-emission area NLA between the red organic emission layer 370R and the green organic emission layer 370G. In this case, the blue color filter 410B is not disposed in a portion of the emission area LA, which corresponds to the red organic emission layer 370R and a portion that corresponds to the green organic emission layer 370G.

The red, green, and blue color filters 410R, 410G, and 410B overlap each other in the non-emission area NLA, which corresponds to a portion where the barrier rib 361 is disposed. Hereinafter, the portion where the red, green, and blue color filters 410R, 410G, and 410B are overlapped with each other is refered to as the overlapped portion of the color filter 410. The red, green, and blue color filters 410R, 410G, and 410B respectively only transmit red light, green light, and blue light, and thus visible rays that include red light, green light, and blue light cannot be transmitted in the portion where the red, green, and blue color filters 410R, 410G, and 410B are overlapped with each other. When the color filter 410 is formed, the green color filter 410G, the red color filter 410R, and the blue color filter 410B are sequentially formed in that order, but a stacking order of the color filter 410 is not limited thereto.

The color filter 410 includes the red, green, and blue color filters 410R, 410G, and 410B, but is not limited thereto. The color filter 410 can include any color that forms three primary colors. For example, the color filter 410 may include a magenta color filter that transmits magenta light, a yellow color filter that transmits yellow light, and a cyan color filter that transmits cyan light.

An overcoat layer 420 is disposed on the color filter 410 to protect the color filter 410 and planarize a layer where the color filter 410 is formed.

Figure 4:
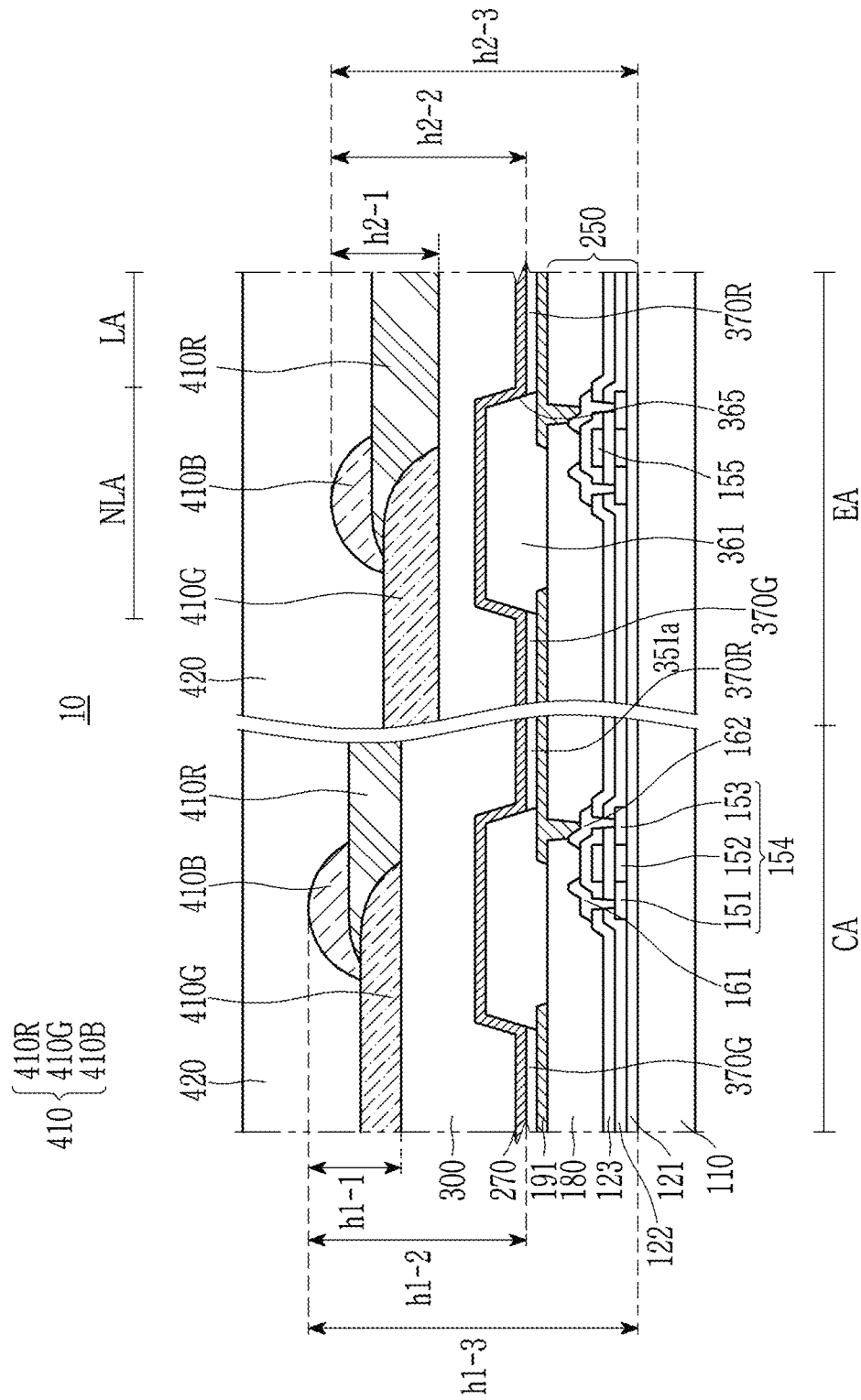
FIG. 4 is a cross-sectional view of the center area and an edge area of the OLED display of FIG. 1 and FIG. 2.

FIG. 4 is a cross-sectional view of a center area CA and an edge area EA of an OLED display according to an exemplary embodiment. The contents described with reference to FIG. 1 to FIG. 3 will not be described.

Referring to FIG. 4, a thickness h2-1 of a color filter 410 in the edge area EA is greater than a thickness h1-1 of the color filter in the center area CA. A top surface of an encapsulation layer 300 is flat in the center area CA, but is gradually lowered in the edge area EA. Thus, when the thickness h2-1 of the color filter 410 is formed thicker in the edge area EA than the thickness h1-1 of the color filter 410 in the center area CA, a distance h1-2 from a top surface of an organic emission layer 370 to the topmost portion of the overlapped portion of the color filter 410 in the center area CA may almost equal a distance h2-2 from the top surface of the organic emission layer 370 to the topmost portion of the overlapped portion of the color filter 410 in the edge area EA. The distances h1-2 and h2-2 from the top surface of the organic emission layer 370 to the overlapped portion of the color filter 410 are vertical distances from a plane that includes the top surface of the organic emission layer 370 to the topmost portion of the overlapped portion of the color filter 410.

For example, a difference between the distance h1-2 from the top surface of the organic emission layer 370 to the topmost portion of the overlapped portion of the color filter 410 in the center area CA and the distance h2-2 from the top surface of the organic emission layer 370 to the topmost portion of the overlapped portion of the color filter 410 in the edge area EA may be less than 7% of the distance h1-2 from the top surface of the organic emission layer 370 to the topmost portion of the overlapped portion of the color filter 410 in the center area CA. Alternatively, a difference between a distance h1-3 from the top surface of the substrate 110 to the topmost portion of the overlapped portion of the color filter 410 in the center area CA and a distance h2-3 from the top surface of the substrate 110 to the topmost portion of the overlapped portion of the color filter 410 in the edge area EA may be less than 5% of the distance h1-3.

In FIG. 4, an area where an overlapped portion of a single color filter 410 is disposed in the center area CA and the edge area EA is described, but this is an example, and the above-described contents may be equally applied to the entire area of the center area CA and the edge area EA.

When distances from the organic emission layer 370 to the overlapped portion of the color filter 410 are different, luminance and a viewing angle characteristic of light emitted from the organic emission layer 370 and then transmitted through the color filter 410 may be changed. Thus, heights of the overlapped portion of the color filter 410 from the organic emission layer 370 are equally formed to assure a uniform light characteristic.

The overlapped area of the color filter 410 is disposed in a non-emission area NLA where the barrier rib 361 is disposed. The overlapped area of the color filter 410 is smaller than the non-emission area NLA where the barrier rib 361 is disposed, and a width of the overlapped area of the color filter 410 is smaller than a width of the non-emission area NLA. This is for the purpose of assurance of a wider viewing angle and improvement of luminance.

Figure 5:
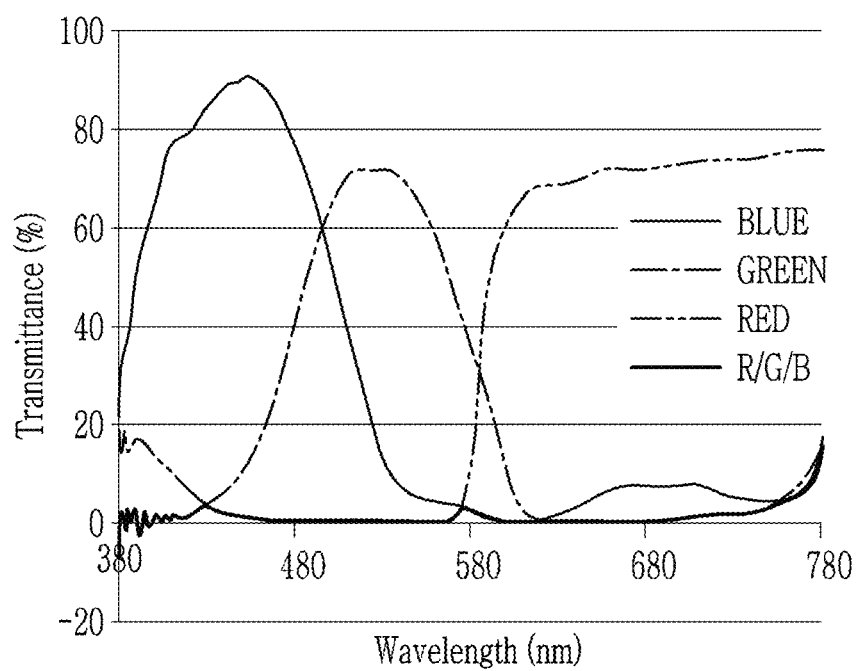
FIG. 5 is a graph that shows transmittance depending on a wavelength of light per color filter.

FIG. 5 is a graph that shows transmittance depending on a wavelength of light for each color filter. In case of a blue color filter BLUE, light with a wavelength of about 450 nm to 480 nm, which corresponds to blue light, is transmitted. In case of a green color filter GREEN, light with a wavelength of about 490 nm to 570 nm, which corresponds to green light, is transmitted. In case of a red color filter RED, light with a wavelength over about 640 nm, which corresponds to red light, is transmitted. When the red, green, and blue color filters are overlapped (R/G/B) with each other, transmittance of light in the entire area of a wavelength of visible ray does not exceed 5%. Thus, light can be blocked when red, green, and blue color filters are overlapped with each other.

When a polarizer is used to reduce reflection of external light in the OLED display, a luminance ratio may be constant without regard to a thickness of the encapsulation layer, but the OLED display becomes thickened, thereby causing a decrease of light emission efficiency. Furthermore, applying a polarizer to a flexible display device may cause damage. In order to solve such a problem, an alternative polarizer structure using a light blocking member and a color filter has been developed to increase the light emission efficiency while reducing reflection of external light and also being applicable to the flexible display.

However, in the polarizer alternative structure that uses a light blocking member and a color filter, the light blocking member is reduced in size as the resolution is increased, and accordingly, it is difficult to form patterns and a defective pattern in the light blocking member pattern is increased. In addition, in the polarizer alternative structure that uses a light blocking member and a color filter, a luminance ratio is changed depending on a thickness of an encapsulation layer, because a distance from an organic emission layer to the light blocking member is changed depending on the thickness of the encapsulation layer. When luminance dispersion is increased due to a luminance difference for each area in the OLED display, a desired image may be distortedly expressed or uniform optical characteristics cannot be assured over the entire surface of the display.

In the OLED display according to the exemplary embodiment, the color filters are overlapped with each other instead of using a light blocking member to thereby prevent transmission of light in the non-emission area. As a result, the number of masks is reduced, thereby simplifying the process, and a high resolution can be realized.

In addition, the distance from the organic emission layer to the color filter overlapped portion is uniformly formed without having a step, thereby optical characteristics over the entire area of the display area can be uniformly maintained. Accordingly, in the OLED display, a uniform luminance ratio in the entire area can be expected regardless of the change in thickness of the encapsulation layer per area.

Hereinafter, an OLED display according to another exemplary embodiment of the present inventive concept will be described with reference to FIG. 6 to FIG. 10.

Figure 6:
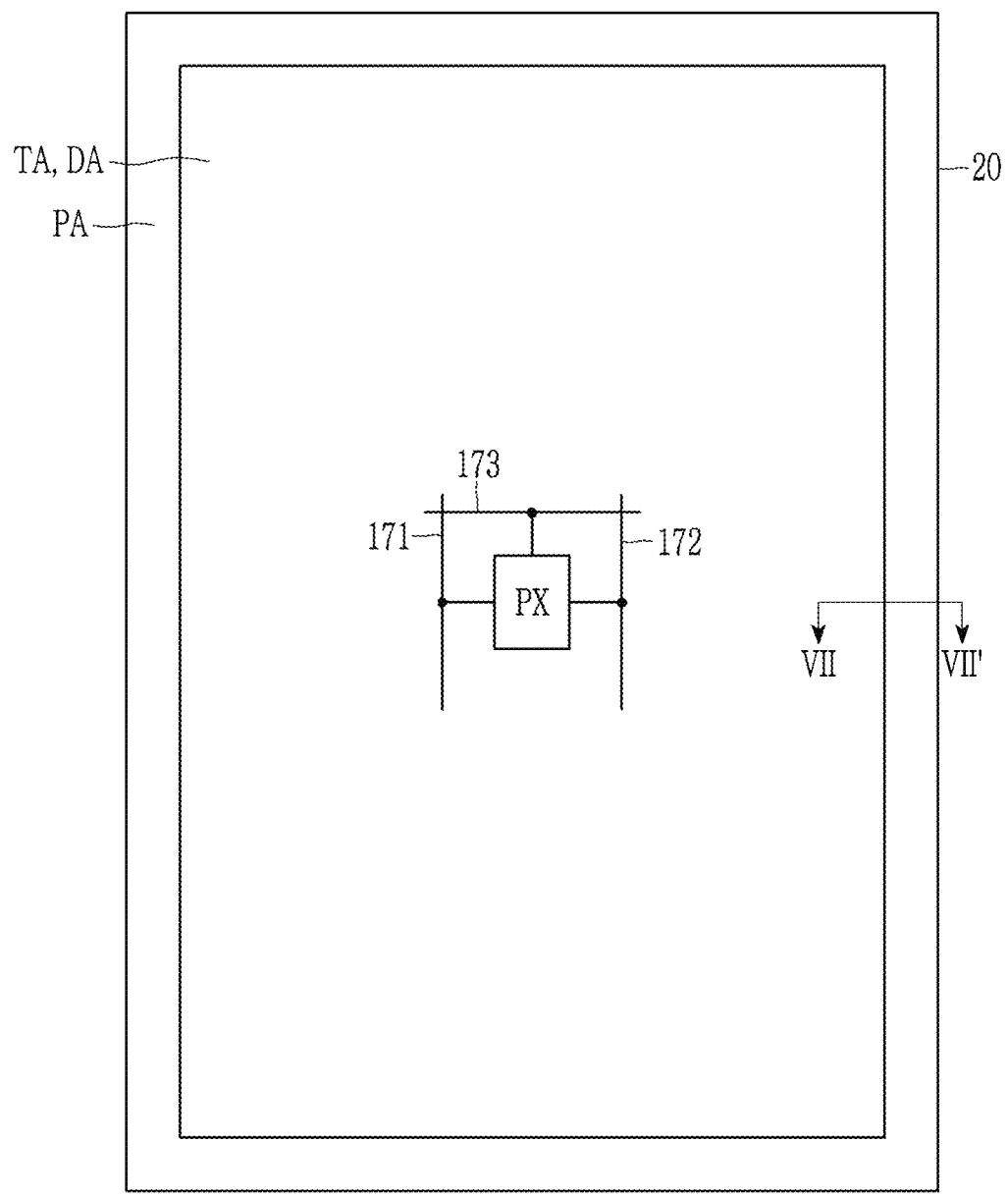
FIG. 6 is a schematic layout view of an OLED display according to another exemplary embodiment of the present inventive concept.

FIG. 6 is a schematic layout view of an OLED display according to another exemplary embodiment of the present inventive concept. The same contents of FIG. 1 to FIG. 5 will not be further described.

Referring to FIG. 6, an OLED display includes a display panel 20. The display panel 20 includes a display area DA, a non-display area PA that is disposed at the periphery of the display area DA, and a touch area TA where a touch can be sensed.

The touch area TA is an area where a touch or motion can be sensed not only when an object directly contacts the display panel 20 but also when the object is near the touch area TA or moves near the touch area TA. The touch area TA may overlap the display area DA. In FIG. 6, the touch area TA is illustrated to match the display area DA, but is not limited thereto. The touch area TA may not match the display area DA.

A touch sense function may be implemented by a capacitive touch sensor that includes touch electrodes. The touch electrode in the capacitive touch sensor forms a capacitor, and senses a change in capacitance of the capacitor that is generated when a touch occurs. Touch information may be generated based on such a change of the capacitance.

Figure 7:
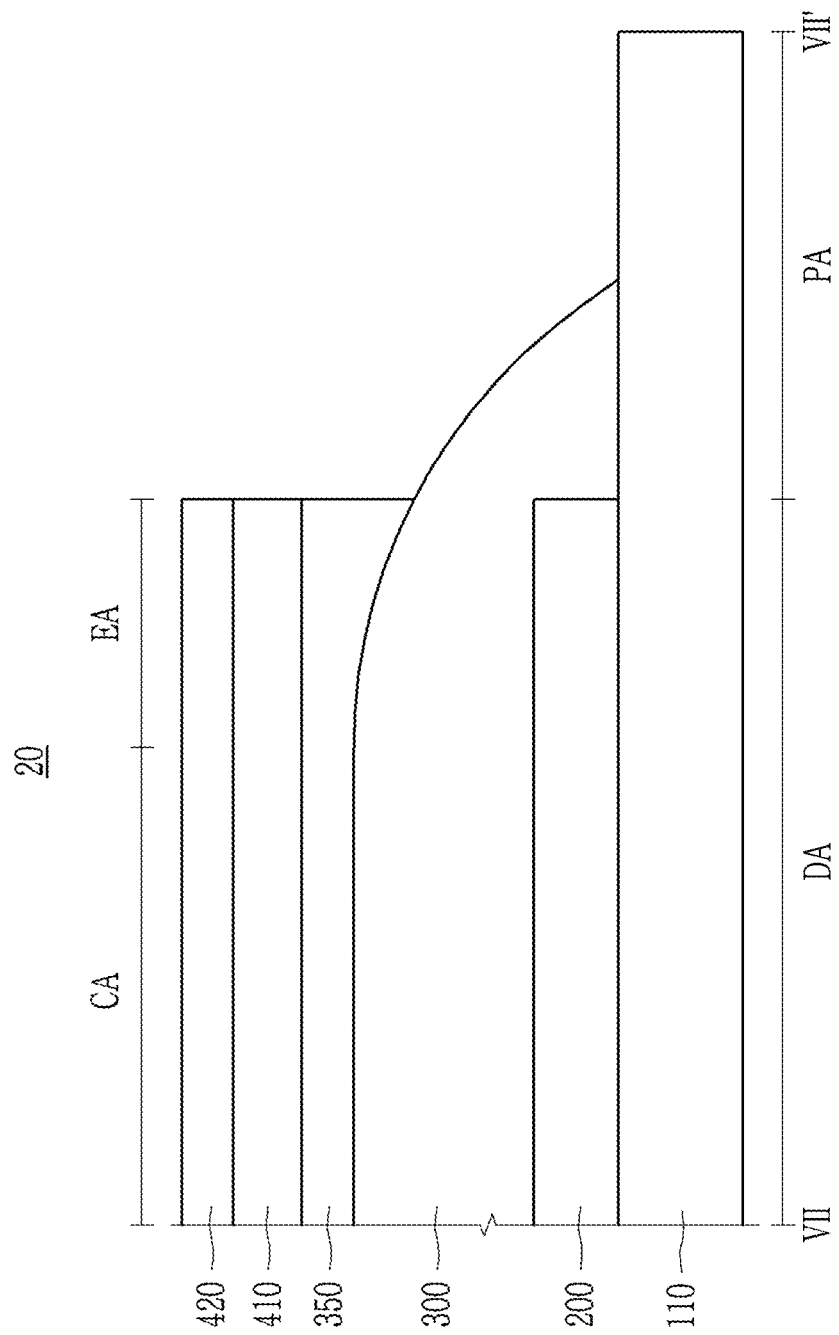
FIG. 7 is a schematic cross-sectional view of the OLED display of FIG. 6, taken along the line VII-VII'.

FIG. 7 is a schematic cross-sectional view of the OLED display, taken along the line VII-VII'. Referring to FIG. 7, the display panel 20 includes a substrate 110, a display layer 200, an encapsulation layer 300, a touch sense layer 350, a color filter 410, and an overcoat layer 420. Other than inclusion of the touch sense layer 350, the OLED display of the exemplary embodiment of FIG. 7 is similar to that of FIG. 2, and therefore a description of the same contents will be omitted.

The encapsulation layer 300 includes a center area CA that is disposed at a center of the encapsulation layer 300 on a plane in the display area DA, and an edge area EA that is disposed at the edge of the encapsulation layer 300 in the display area DA. The edge area EA of the encapsulation layer 300 is disposed at an area that contacts the non-display area PA in the display area DA, and the center area CA is disposed at a distance from the non-display area PA, while disposing the edge area EA therebetween. The edge area EA may be disposed at a peripheral portion that surrounds the center area CA.

In the center area CA, the encapsulation layer 300 may substantially have a flat top surface. A thickness of the encapsulation layer 300 in the edge area EA is smaller than a thickness of the encapsulation layer 300 in the center area CA. A thickness of the encapsulation layer 300 is gradually decreased in the edge area EA of the display area DA, and accordingly, the top surface of the encapsulation layer 300 is gradually lowered.

The touch sense layer 350 is disposed on the encapsulation layer 300. A thickness of the touch sense layer 350 is gradually increased toward an end portion thereof. Since the top surface of the encapsulation layer 300 is gradually lowered toward the end portion, a bottom surface of the touch sense layer 350 is also gradually lowered to the end portion thereof. As the bottom surface of the touch sense layer 350 is lowered, the thickness of the touch sense layer 350 is formed to be large such that a distance from the substrate 110 to the top surface of the touch sense layer 350 is almost the same not only in the center area CA of the display area DA but also in the edge area EA.

The touch sense layer 350 uses a display panel as the substrate 110 rather than having its own substrate. Such a touch sense layer 350 may overall be very thin such that the display panel 20 can be formed to be thin, and is appropriate for a flexible display.

The color filter 410 is disposed on the touch sense layer 350. Unlike FIG. 2, the color filter 410 may have the same thickness in the center area CA and in the edge area EA. Since a height from the substrate 110 to the top surface of the touch sense layer 350 is uniform, a height from the substrate 110 or the display layer 200 to the color filter 410 may be uniform overall in the display area DA even through the color filter 410 has a uniform thickness. For example, a difference between a distance from the substrate 110 or the display layer 200 to the top surface of the color filter 410 in the center area CA and a distance from the substrate 110 or the display layer 200 to the top surface of the color filter 410 in the edge area EA may be less than 5% of a distance from the substrate 110 or the display layer 200 to the top surface of the color filter 410 in the center area CA.

Figure 8:
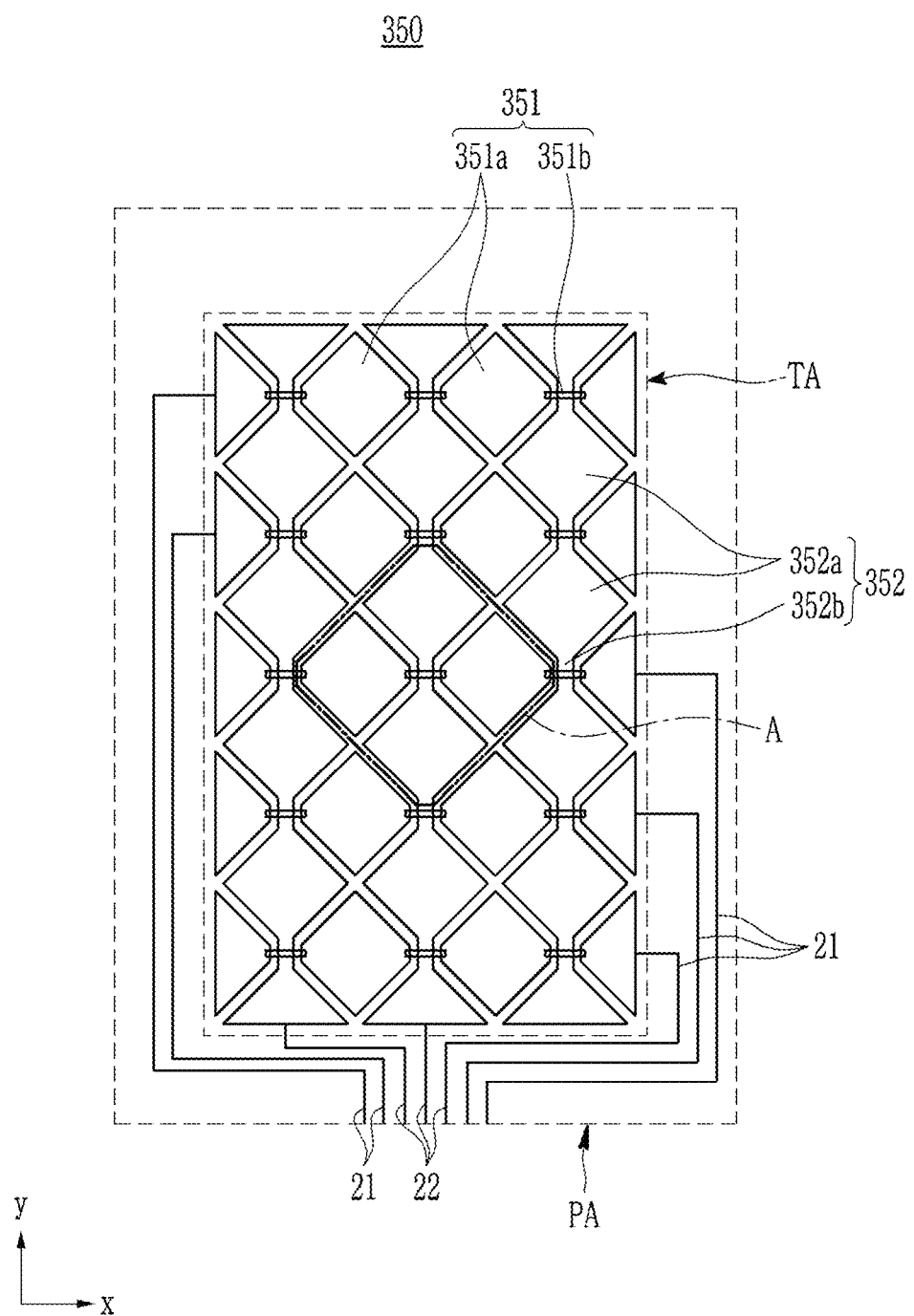
FIG. 8 is a top plan view of a touch sense layer of FIG. 7.

FIG. 8 is a schematic top plan view of the touch sense layer 350 of FIG. 7. The touch sense layer 350 includes a first touch electrode 351 and a second touch electrode 352.

The first touch electrode 351 includes a plurality of first touch cells 351a, each formed in the shape of a rhombus, and a plurality of first connection portions 351b that connect the plurality of first touch cells 351a along a first direction x. The first touch electrode 351 may be a transmitter (Tx) touch electrode to which a first touch signal is transmitted to sense a coordinate value in a second direction y. The shape of the first touch cell 351a is not limited to the rhombus, and may be variously modified.

The second touch electrode 352 may include a plurality of second touch cells 352a, each formed in the shape of a rhombus, and a plurality of second connection portions 352b that connect the plurality of second touch cells 352a along the second direction y. The second touch electrode 352 may be a receiver (Rx) touch electrode to which a second touch signal is transmitted to sense a coordinate value in the first direction x. The shape of the second touch cell 352a is illustrated as a rhombus, but is not limited thereto. On a plane, the first touch cell 351a and the second touch cell 352a neighbor each other, and the first connection portion 351b and the second connection portion 352b cross each other.

The first touch electrode 351 and the second touch electrode 352 are disposed apart from each other, and capacitance may be formed between the first touch electrode 361 and the second touch electrode 352. When there is a touch by a user, the capacitance between the first touch electrode 351 and the second touch electrode 352 is changed, and a controller (not shown) senses such a change and detects a touched location.

The first touch cell 351a, the second touch cell 352a, and the second connection portion 352b may be disposed on the same layer. In addition, the first connection portion 351b may be disposed on a layer that is different from the layer where the first touch cell 351a, the second touch cell 352a, and the second connection portion 352b are disposed. Specifically, the first connection portion 351b may be disposed below the first touch cell 351a, the second touch cell 352a, and the second connection portion 352b. However, this is not restrictive. The first connection portion 351b may be disposed above the first touch cell 351a, the second touch cell 352a, and the second connection portion 352b. As described hereinafter, the first connection portion 351b may be connected with the first touch cell 351a through an opening.

The second touch cell 352a and the second connection portion 352b of the second touch electrode 352 may be integrally formed. Thus, the first touch cell 351a, the second touch cell 352a, and the second connection portion 352b may be simultaneously formed through the same process. However, it is not required that the second connection portion 352b is simultaneously formed with the first touch cell 351a and the second touch cell 352a, and they may be separately formed through a different process using a different material.

In addition, in the present exemplary embodiment, the first connection portion 351b is formed on a layer that is different from a layer where the first touch cell 351a, the second touch cell 352a, and the second connection portion 352b are formed, and the first touch cell 351a, the second touch cell 352b, and the first connection portion 351b may be formed on the same layer and the second connection portion 352b may be formed on a layer that is different from a layer where the first touch cell 351a, the second touch cell 352a, and the first connection portion 351b are formed.

In addition, the first touch cell 351a and the first connection portion 351b of the first touch electrode 351 may be disposed on the same layer, the second touch cell 352a and the second connection portion 352b of the second touch electrode 352 may be disposed on the same layer, and the first touch electrode 351 and the second touch electrode 352 may be disposed on different layers.

The first touch electrode 351 and the second touch electrode 352 may include a low-resistive metal such as silver (Ag), aluminum (Al), copper (Cu), chromium (Cr), nickel (Ni), and the like, or may include a conductive nanomaterial such as a silver nanowire, carbon nanotubes, and the like. Such a first touch electrode 351 has low resistance, and accordingly RC delay can be reduced, and since the first touch electrode 351 has excellent flexibility, cracks cannot be easily generated even when deformation such as twist iteratively occurs.

The first touch sense layer 350 includes first wires 21 and second wires 22. The first wire 21 and the second wire 22 are respectively connected with the first touch electrode 351 and the second touch electrode 352 and transmit a touch signal. The first touch electrode 351 and the second touch electrode 352 may be disposed in a touch area TA, and the first wire 21 and the second wire 22 may be disposed in a non-display area PA that is outside the touch area TA.

Figure 9:
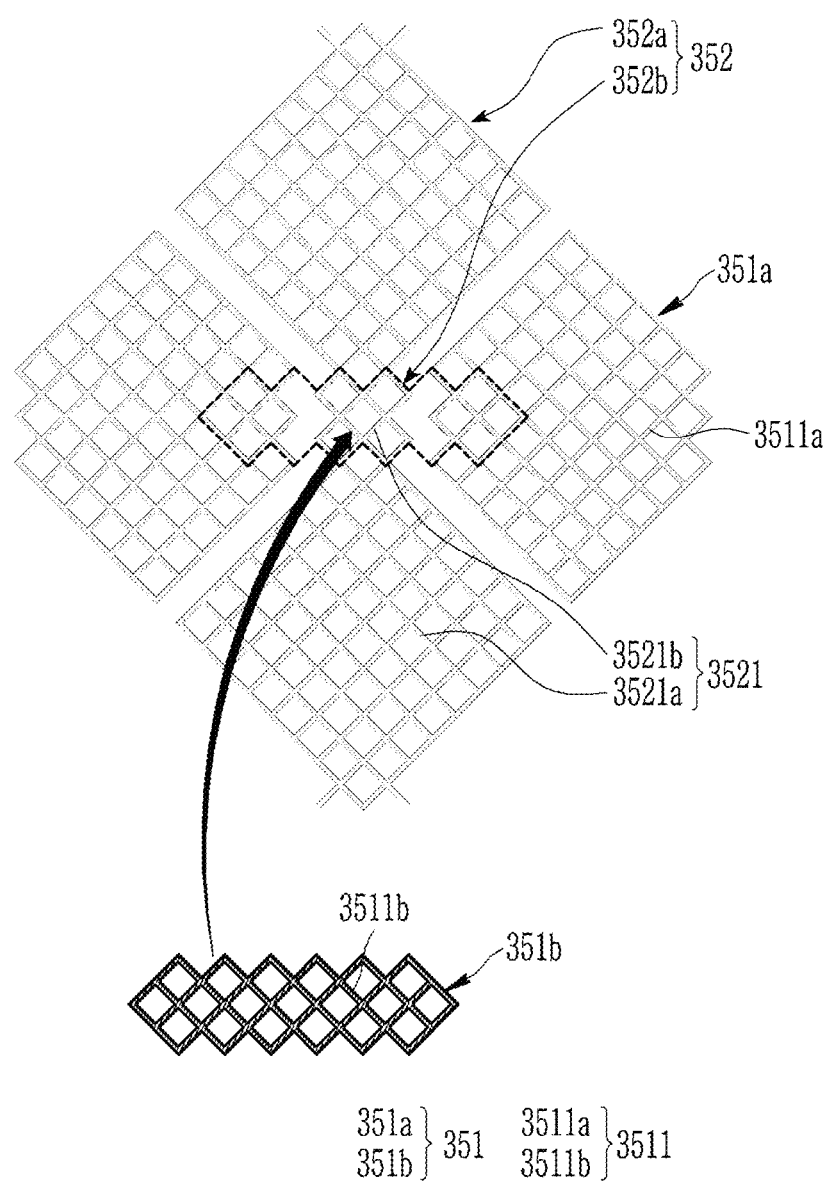
FIG. 9 is an enlarged layout view of the portion A of FIG. 8.

FIG. 9 is an enlarged layout view of the portion A of FIG. 8. In FIG. 9, the first connection portion 351b that is disposed on a layer that is different from a layer where the first touch cell 351a of the first touch electrode 351 and the second touch electrode 352 are disposed is separately illustrated.

Referring to FIG. 9, the first touch electrodes 351 and the second electrodes 352 may be arranged in a mesh pattern. In this case, the first touch electrodes 351 and the second touch electrodes 352 include a plurality of unit electrode lines 3511 and 3521, each having a minute width and parallelly arranged in a third direction and a fourth direction that crosses the third direction. The unit electrode lines 3511 of the first touch electrode 351 include a unit electrode line 3511a of the first touch cell 351a and a unit electrode line 3511b of the first connection portion 351b. The unit electrode lines 3521 of the second touch electrode 352 include a unit electrode line 3521a of the second touch cell 352a and a unit electrode line 3521b of the second connection portion 352b. Some of the unit electrode lines 3511 and 3521 arranged in parallel to the third direction and the remainder of unit electrode lines 3511 and 3521 arranged in parallel to the fourth direction that crosses the third direction vertically cross each other, such that rhombus-shaped openings are formed. That is, the mesh patterns of the first touch electrode 351 and the second touch electrode 352 may have a constant lattice shape according to an arrangement of the unit electrode lines 3511 and 3521.

The first touch electrode 351 and the second touch electrode 352 are formed of the plurality of unit electrode lines 3511 and 3521 and thus light emitted from the OLED display is not blocked, and parasitic capacitance can be minimized by reducing an area where the first touch electrode 351 and the second touch electrode 352 overlap conductive wires of the display panel.

The first touch electrode 351 and the second touch electrode 352 include rhombus-shaped openings, but are not limited thereto. The openings may have any shape such as a quadrangle, a polygon, and the like. In addition, the third direction and the fourth direction in which the unit electrode lines 3511 and 3521 extend are not limited to oblique directions, and they may be parallel with the first direction or the second direction.

The first connection portion 351b may be disposed below the first touch cell 351a, the second touch cell 352a, and the second connection portion 352b. In the FIG. 9, the first connection portions 351b are disposed at a portion indicated by the dotted line, and thus partially overlap the first touch cells 351a and the second connection portion 352b. The second connection portion 352b is insulated from the first connection portion 351b by an inorganic insulation layer, which will be described later. The first connection portion 351b is connected with the first touch cell 351a in an area overlapping the first cell 351a.

Figure 10:
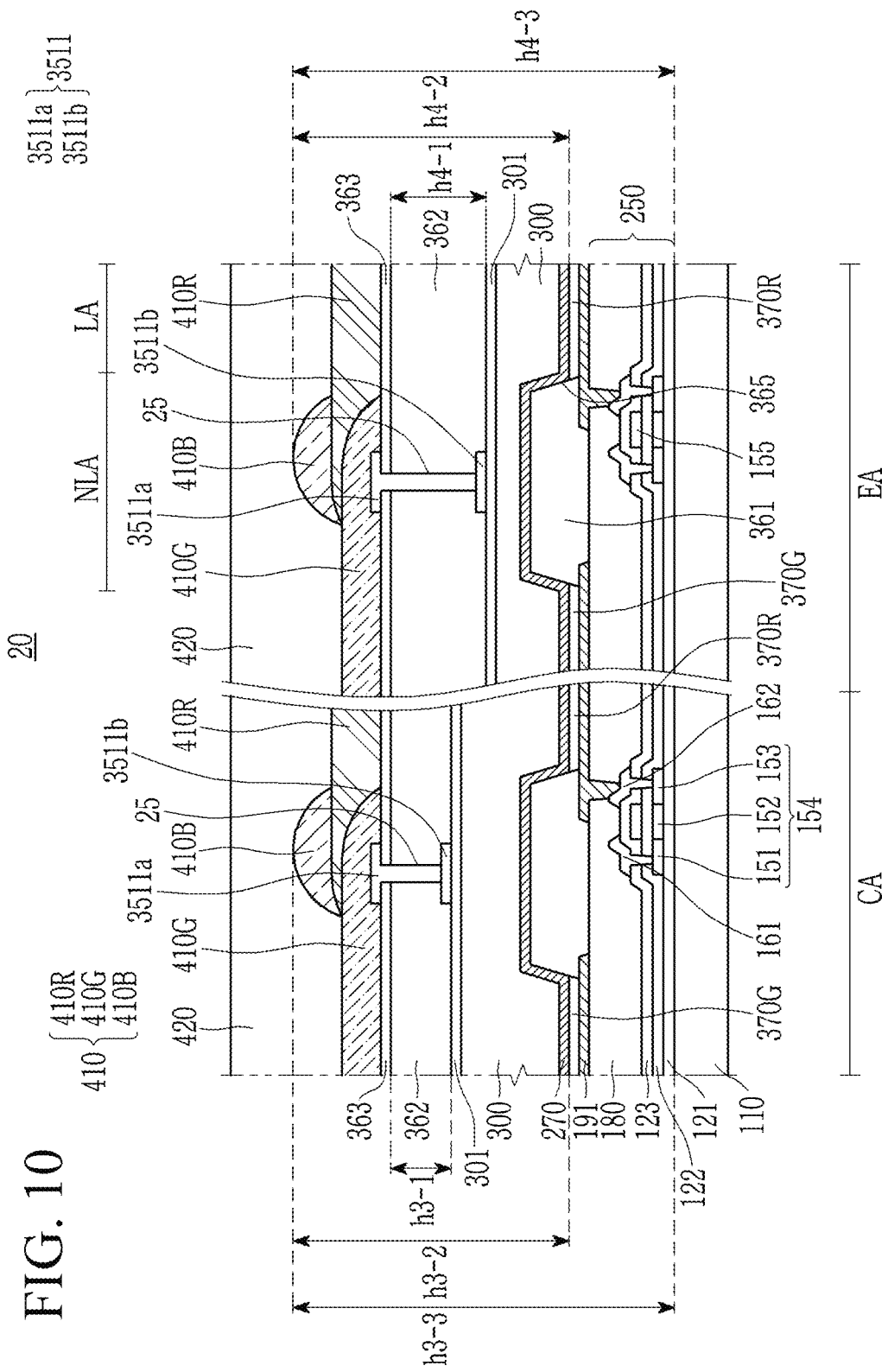
FIG. 10 is a cross-sectional view of a center area and an edge area of the OLED display of FIG. 6 to FIG. 9.

FIG. 10 is a cross-sectional view of the center area CA and the edge area EA of the OLED display according to the exemplary embodiment of FIG. 6 to FIG. 9. The description of configurations that are the same as described above will be omitted. Specifically, FIG. 10 shows a cross-section of the unit electrode line 3511a of the first touch cell 351a and the unit electrode line 3511b of the first connection portion 351b.

The OLED display according to the exemplary embodiment may further include an inorganic layer 301 on the encapsulation layer 300. The inorganic layer 301 may include at least one of a metal oxide, a metal oxynitride, a silicon oxide, a silicon nitride, and a silicon oxynitride. The inorganic layer 301 protects the encapsulation layer 300 by covering the same, and may prevent moisture permeation. In addition, the inorganic layer 301 may reduce parasitic capacitance between the common electrode 270 and the touch sense layer 350.

The touch sense layer 350 is disposed on the inorganic layer 301. The touch sense layer 350 includes the first touch electrode 351, a planarization layer 362, an inorganic insulation layer 363, and the second touch electrode 352. In FIG. 10, a portion where the unit electrode line 3511a of the first touch cell 351a and the unit electrode line 3511b of the first connection portion 351b in an area where the first touch cells 351a and the first connection portion 351b of the first touch electrode 351 are overlapped with each other is illustrated.

Referring to FIG. 10, the unit electrode line 3511b of the first connection portion 351b is disposed on the inorganic layer 301, and the planarization layer 362 is disposed on the unit electrode line 3511b of the first connection portion 351b. The planarization layer 362 may include an organic material such as an acryl-based resin. A thickness h4-1 of the planarization layer 362 in the edge area EA is greater than a thickness h3-1 of the planarization layer 362 in the center area CA. In the edge area EA, a thickness of the encapsulation layer 300 is gradually reduced. However, the thickness h4-1 of the planarization layer 362 is increased in the edge area EA such that a distance from the substrate 110 to the top surface of the planarization layer 362 may be constant in the center area CA and the edge area EA.

The inorganic insulation layer 363 is disposed on the planarization layer 362. The inorganic insulation layer 363 may include an inorganic material such as a silicon nitride (SiNx) or a silicon oxide (SiO$_x$).

The unit electrode lines 3511a of the first touch cells 351a are disposed on the inorganic insulation layer 363. In addition, although not illustrated, the second touch cells 351a and the second connection portions 352b that are connected to the second touch cells 352a are disposed on the inorganic insulation layer 363. The first touch cell 351a and the second touch cell 352a are disposed, neighboring each other in a plan view. The first connection portion 351b and the second connection portion 352b overlap each other on a plane, but they are insulated from each other by the inorganic insulation layer 363.

As described in FIG. 9, the first touch cell 351a of the first touch electrode 351 overlaps a part of the first connection portion 351b. In an area where the first touch cell 351a and the first connection portion 351b overlap each other, the first touch cell 351a and the first connection portion 351b are connected with each other by contacting each other. Specifically, the planarization layer 362 and the inorganic insulation layer 363 may include openings 25, which are areas through which the first connection portions 351b are exposed, and when the unit electrode lines 3511a of the first touch cells 351a are formed, a material that forms the unit electrode line 3511a of the first touch cell 351a fills the opening 35 such that the first touch cell 351a may be connected with the unit electrode line 3511b of the first connection portion 351b by directly contacting the same. That is, the first touch cell 351a is not only disposed on the inorganic insulation layer 363 but is also disposed in the opening 25 through which the first connection portion 351*b* is exposed and thus may be connected with the first connection portion 351*b*.

The unit electrode line 3511 of the first touch electrode 351 and the unit electrode line 3521 of the second touch electrode 352 may be formed in the shape that corresponds to an overlapping portion of the color filter 410 or the barrier rib 361 on a plane. The unit electrode line 3511 of the first touch electrode 351 and the unit electrode line 3521 of the second touch electrode 352 may be disposed in an area where the barrier rib 361 or the overlapping portion of the color filter 410 is disposed.

A pixel opening 365 may overlap openings of the first touch electrode 351 and the second touch electrode 352. In this case, the plurality of unit electrode lines 3511 and 3521 may not be disposed in the entire area where the overlapping portions of the color filters 410R, 410G and 410B or the barrier ribs 361 are disposed, and may be overlapped with an overlapping portion of some color filter 410 or barrier rib 361. That is, only one pixel opening 365 may be disposed between the plurality of unit electrode lines 3511 and 3521, but this is not restrictive. A plurality of openings 365 may be disposed between the plurality of unit electrode lines 3511 and 3521.

The color filter 410 is disposed on the first touch cell 351*a* and the inorganic insulation layer 363. Unlike the exemplary embodiment of FIG. 4, the color filter 410 may have a constant thickness in the center area CA and the edge area EA in the exemplary embodiment of FIG. 10. Although the color filter 410 has a constant thickness, when the thickness h4-1 of the planarization layer 362 in the edge area EA is formed to be greater than the thickness h3-1 of the planarization layer 362 in the center area CA, a distance h3-2 from the top surface of the organic emission layer 370 to the topmost portion of the overlapped portion of the color filter 410 in the center area CA and a distance h4-2 from the top surface of the organic emission layer 370 to the topmost portion of the overlapped portion of the color filter 410 in the edge area EA may be approximately the same. The distances h3-2 and h4-2 from the top surface of the organic emission layer 370 to the topmost portion of the overlapped portion of the color filter 410 are vertical distances to the topmost portion of the overlapped portion of the color filter 410 with reference to a plane that includes the top surface of the organic emission layer 370.

For example, a difference between the distance h3-2 from the top surface of the organic emission layer 370 to the topmost portion of the overlapped portion of the color filter 410 in the center area CA and the distance h4-2 from the top surface of the organic emission layer 370 to the topmost portion of the overlapped portion of the color filter 410 in the edge area EA may be less than 7% of the distance h3-2 from the top surface of the organic emission layer 370 to the topmost portion of the overlapped portion of the color filter 410 in the center area CA. Alternatively, a difference between a distance h3-3 from the top surface of the substrate 110 to the topmost portion of the overlapped portion of the color filter 410 in the center area CA and a distance h4-3 from the top surface of the substrate 110 to the topmost portion of the overlapped portion of the color filter 410 in the edge area EA may be less than 5% of the distance h3-3.

The color filter 410 overlapped areas are disposed in the non-emission layers NLA where the barrier ribs 361 are disposed. The color filter 410 overlapped areas are smaller than the non-emission layer NLA where the barrier rib 361 is disposed, and a width of the color filter 410 overlapped areas is smaller than a width of the non-emission area NLA.

In FIG. 10, an area where unit electrode lines 3511 and 3521 are respectively disposed in the center area CA and the edge area EA is illustrated, but this is an example, and the above-described contents may be equally applied to the entire area of the center area CA and the edge area EA.

Meanwhile, the first touch cell 351*a*, the second touch cell 352*a*, and the second connection portion 352*b* may be switched with the first connection portion 351*b* in location. That is, the first touch cell 351*a*, the second touch cell 352*a*, and the second connection portion 352*b* may be disposed on the inorganic layer 301, and may be covered by the planarization layer 362 and the inorganic insulation layer 363. In this case, the first connection portion 351*b* may be disposed on the inorganic insulation layer 363.

Figure 11:
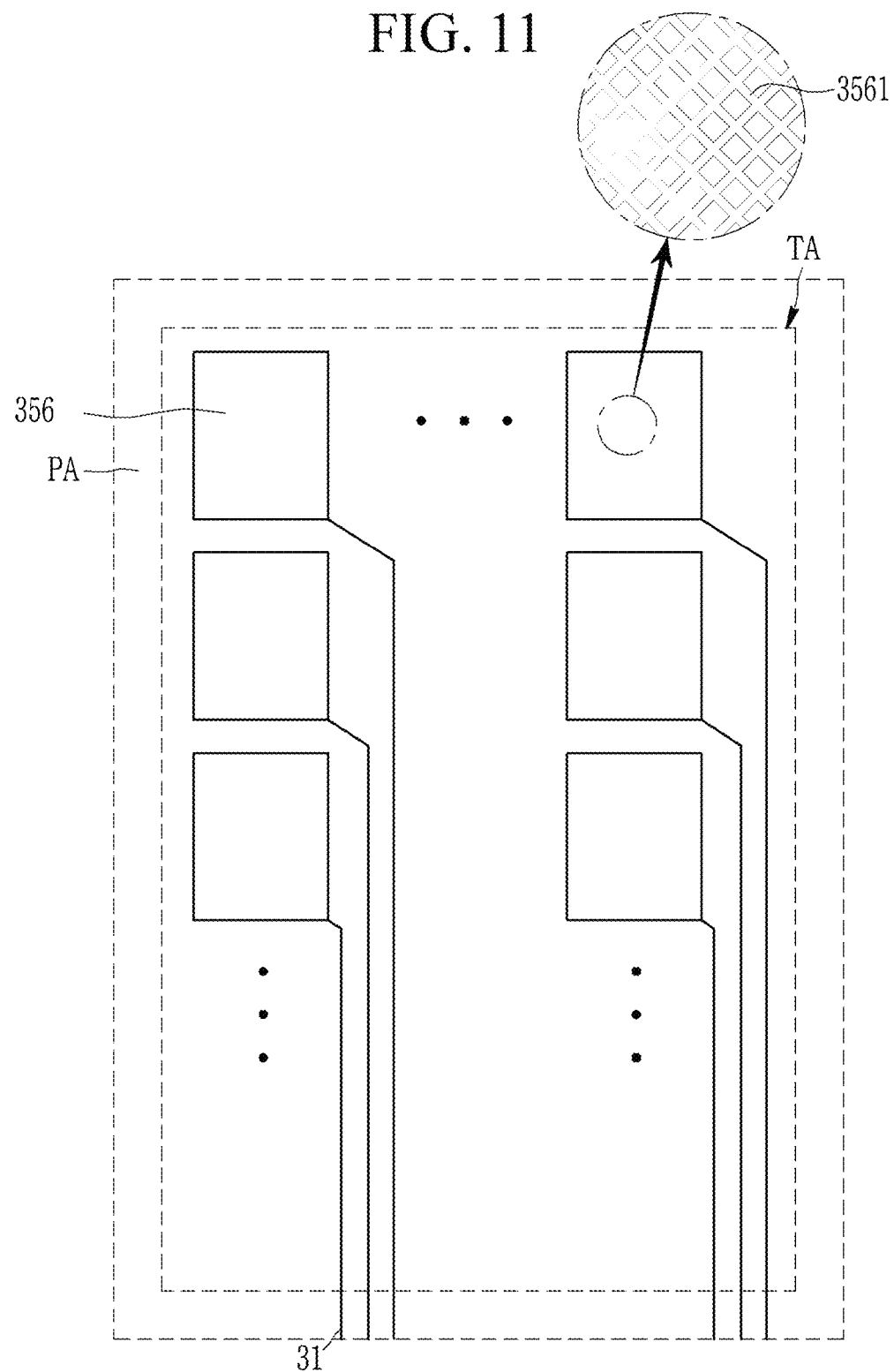
FIG. 11 is a top plan view of a touch sense layer included in an OLED display according to another exemplary embodiment.
Figure 12:
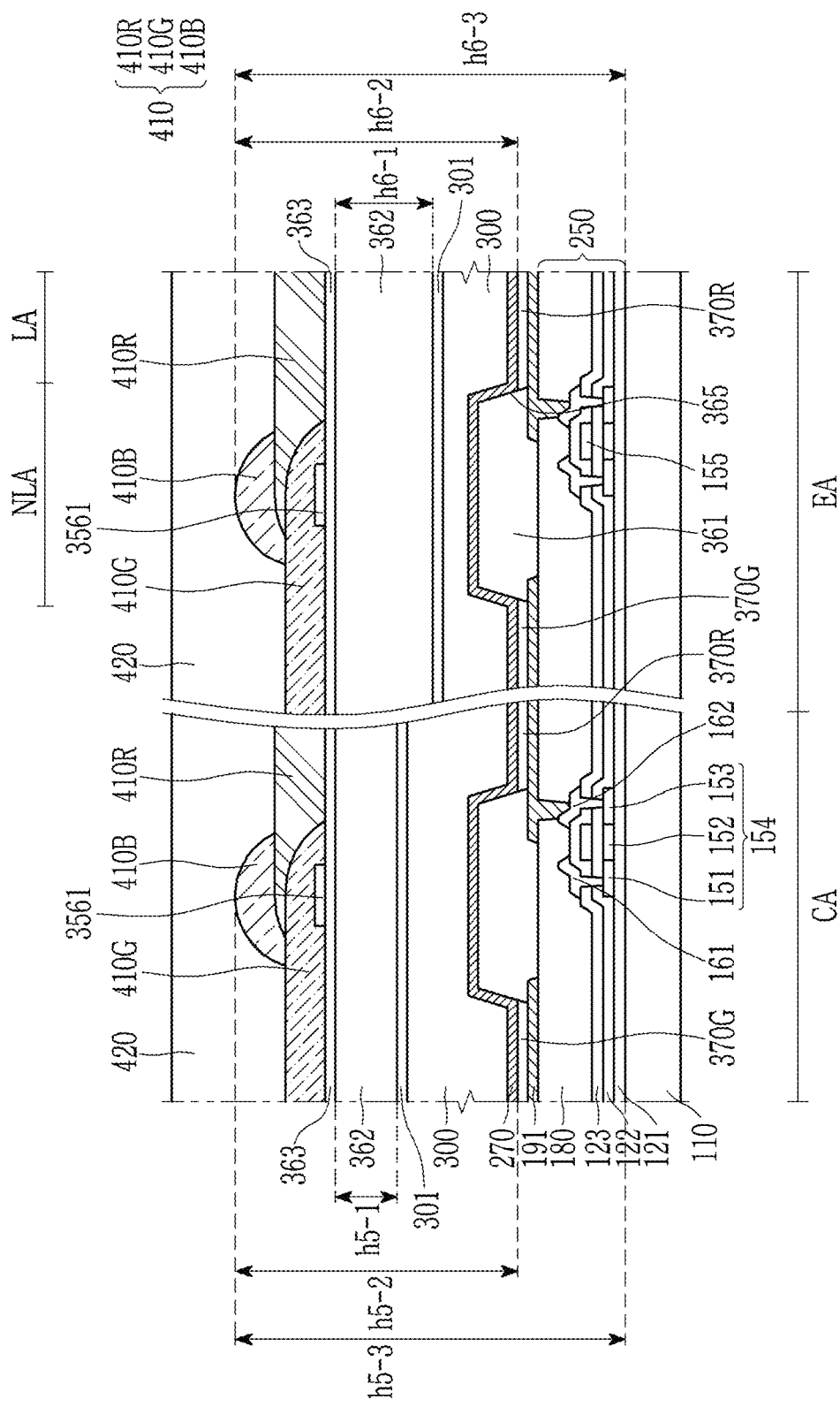
FIG. 12 is a cross-sectional view of a center area and an edge area of the OLED display that includes the touch sense layer of FIG. 11.

Referring to FIG. 11 and FIG. 12, an OLED display according to another exemplary embodiment will be described. FIG. 11 is a top plan view of a touch sense layer included in an OLED display of another exemplary embodiment. A schematic layout view and a cross-sectional view of the OLED display of the present exemplary embodiment are the same as those of FIG. 6 and FIG. 7.

A touch sense layer 350 includes a plurality of touch electrodes 356 that are all formed on the same layer, and a plurality of wires 31 that are respectively connected with the touch electrodes 356. The touch sense layer 350 detects whether or not a touch occurs and touch coordinates based on capacitance formed between the touch electrodes 356 and a pointer such as a finger, a pen, and the like.

A touch area TA is an area where a touch is applied and a touch can be sensed, and may overlap a display area DA where an image is displayed. The plurality of touch electrodes 356 may be arranged in a matrix format, and may be formed on the same layer in a cross-sectional view.

Each of the touch electrodes 356 may be formed in the shape of a quadrangle, but are not limited thereto. The plurality of touch electrodes 356 are separated from each other in the touch area TA, and the touch electrodes 356 may be connected with a sense signal controller (not shown), respectively, through different wires 31.

The touch electrodes 356 may be formed in a mesh pattern. In this case, the first touch electrodes 351 and the second touch electrodes 352 include a plurality of unit electrode lines 3561, each having a minute width and parallelly arranged in a third direction and a fourth direction that crosses the third direction. Unit electrode lines arranged in the third direction and unit electrode lines 3561 arranged in the fourth direction vertically cross each other, such that rhombus-shaped openings are formed. That is, the mesh patterns of the touch electrode 356 may have a constant lattice shape according to the arrangement of the unit electrode lines 3561. The touch electrodes 356 include rhombus-shaped openings, but this is not restrictive. The shape of the opening may be any shape such as a quadrangle, a polygon, and the like. In addition, the third direction and the fourth direction in which the unit electrode lines 3561 extend are not limited to oblique directions.

The touch electrodes 356 of the present exemplary embodiment receive a sense input signal from a sense signal controller (not shown) through the wires 31, and generate a sense output signal according to a contact and transmit the generated signal to the sense signal controller. Each touch electrode 356 forms a self-sensing capacitor, and thus receives the sense input signal and then is charged with a predetermined charge. When a touch is made by an external object such as a finger, the amount of charges charged in the left-sensing capacitor is changed such that a sense output signal that is different from the input sense signal may be output. Based on the sense output signal, contact information such as whether or not a contact is made, a contact location, and the like can be provided.

The wires 31 may be disposed on the same layer where the touch electrodes 356 are disposed, and may be formed of the same material as the touch electrodes 356. However, this is not restrictive, and the wire 31 may be disposed on a layer that is different from the layer where the touch electrode 356 is disposed, and thus may be connected with the touch electrode 356 through an additional connection portion.

FIG. 12 is a cross-sectional view of a center area CA and an edge area EA of another OLED display that includes the touch sense layer of FIG. 11. Specifically, FIG. 12 shows a cross-section of a unit electrode line 3561 of a touch electrode 356. The description of the same configuration as that described above will be omitted.

Referring to FIG. 12, an inorganic layer 301 is disposed on an encapsulation layer 300, and a planarization layer 362 is disposed on the inorganic layer 301. The planarization layer 362 may include an organic material such as an acryl-based resin. A thickness of the planarization layer 362 is greater in the edge area EA than in the center area CA. A distance from the substrate 110 to the top surface of the planarization layer 362 is constant in the center area CA and the edge area EA.

An inorganic insulation layer 363 is disposed on the planarization layer 362. The inorganic insulation layer 363 may include an inorganic material such as a silicon nitride (SiNx) or a silicon oxide (SiO$_x$).

The unit electrode lines 3561 of the touch electrode 356 are disposed on the inorganic insulation layer 363. The unit electrode lines 3561 of the touch electrode 356 may have a shape that corresponds to a color filter 410 overlapped portion or a barrier rib 361 on a plane. The unit electrode line 3561 of the touch electrode 356 may be disposed in an area where the barrier rib 361 or the color filter 410 overlapped portion is disposed. A pixel opening 365 may overlap an opening of the touch electrode 356. In this case, the plurality of unit electrode lines 3511 and 3521 may not be disposed in the entire area where the overlapping portions of the color filters 410R, 410G and 410B or the barrier ribs 361 are disposed, and may be overlapped with an overlapping portion of some color filter 410 or barrier rib 361. That is, only one pixel opening 365 may be disposed between the plurality of unit electrode lines 3511 and 3521, but this is not restrictive. A plurality of openings 365 may be disposed between the plurality of unit electrode lines 3561.

The color filter 410 is disposed on the touch electrodes 356. Unlike the exemplary embodiment of FIG. 4, the thickness of the color filter 410 may be constant in the center area CA and the edge area EA according to the present exemplary embodiment.

Although the color filter 410 has a constant thickness, when the thickness h6-1 of the planarization layer 362 in the edge area EA is formed to be greater than the thickness h5-1 of the planarization layer 362 in the center area CA, a distance h5-2 from the top surface of the organic emission layer 370 to the topmost portion of the overlapped portion of the color filter in the center area CA and a distance h6-2 from the top surface of the organic emission layer 370 to the topmost portion of the overlapped portion of the color filter 410 in the edge area EA may be approximately the same. The distances h5-2 and h6-2 from the top surface of the organic emission layer 370 to the topmost portion of the overlapped portion of the color filter 410 are vertical distances to the topmost portion of the overlapped portion of the color filter 410 with reference to a plane that includes the top surface of the organic emission layer 370.

For example, a difference between the distance h5-2 from the top surface of the organic emission layer 370 to the topmost portion of the overlapped portion of the color filter 410 in the center area CA and the distance h6-2 from the top surface of the organic emission layer 370 to the topmost portion of the overlapped portion of the color filter 410 in the edge area EA may be less than 7% of the distance h5-2 from the top surface of the organic emission layer 370 to the topmost portion of the overlapped portion of the color filter 410 in the center area CA. Alternatively, a difference between a distance h5-3 from the top surface of the substrate 110 to the topmost portion of the overlapped portion of the color filter 410 in the center area CA and a distance h6-3 from the top surface of the substrate 110 to the topmost portion of the overlapped portion of the color filter 410 in the edge area EA may be less than 5% of the distance h5-3.

In FIG. 12, an area where a single unit electrode line 3561 is disposed in the center area CA and the edge area EA is illustrated, but this is an example, and the above-described contents may be equally applied to the entire area of the center area CA and the edge area EA.

While this inventive concept has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 10, 20: display panel | 110: substrate |
| 191: pixel electrode | 200: display layer |
| 250: pixel circuit | 270: common electrode |
| 300: encapsulation layer | 301: inorganic layer |
| 350: touch sense layer | 351: first touch electrode |
| 352: second touch electrode | 356: touch electrode |
| 361: barrier rib | 362: planarization layer |
| 363: inorganic insulation layer | 370: organic emission layer |
| 410: color filter | 420: overcoat layer |
| CA: center area | EA: edge area |

What is claimed is:

1. An organic light emitting diode (OLED) display comprising:
    a substrate that includes a display area and a non-display area;
    a pixel circuit that is disposed in the display area;
    organic light emitting diodes that are disposed on the pixel circuit;
    a partition layer having openings that correspond to the organic light emitting diodes;
    an encapsulation layer that covers the pixel circuit, the organic light emitting diodes, and the partition layer; and
    a color filter that is disposed on the encapsulation layer,
    wherein the encapsulation layer comprises an edge area that is adjacent to the non-display area in the display area and a center area that is not directly adjacent to the non-display area,
    the edge area and the center area overlap the display area in a plan view,
    the color filter comprises a first color filter, a second color filter, a third color filter, and color filter overlapped portions where the first color filter, the second color filter, and the third color filter are overlapped,
the color filter overlapped portions overlap areas where the partition layer is disposed in a plan view, and
a thickness of the color filter is greater in the edge area than in the center area.

2. The OLED display of claim 1, wherein the organic light emitting diode comprises an organic emission layer, and
a difference between a distance from a top surface of the organic emission layer to a topmost portion of the overlapped portion of the color filter in the center area and a distance from the top surface of the organic emission layer to the topmost portion of the overlapped portion of the color filter in the edge area is less than 7% of the distance from the top surface of the organic emission layer to the topmost portion of the overlapped portion of the color filter in the center area.

3. The OLED display of claim 2, wherein a thickness of the encapsulation layer in the center area is greater than a thickness of the encapsulation layer in the edge area.

4. The OLED display of claim 3, wherein the edge area surrounds the center area, and a thickness of the encapsulation layer in the edge area is less than 90% of a maximum thickness of the encapsulation layer in the center area.

5. The OLED display of claim 4, wherein the first color filter, the second color filter, and the third color filter are respectively a red color filter, a green color filter, and a blue color filter.

6. The OLED display of claim 4, wherein the first color filter, the second color filter, and the third color filter are respectively a magenta color filter, a yellow color filter, and a cyan color filter.

7. An organic light emitting diode (OLED) display comprising:
a substrate that includes a display area and a non-display area;
a pixel circuit that is disposed on the display area;
organic light emitting diodes that are disposed on the pixel circuit;
a partition layer having openings that correspond to the organic light emitting diodes;
an encapsulation layer that covers the pixel circuit, the organic light emitting diodes, and the partition layer;
a touch sense layer that is disposed on the encapsulation layer; and
a color filter that is disposed on the touch sense layer,
wherein the encapsulation layer comprises an edge area that is adjacent to the non-display area in the display area and a center area not directly adjacent to the non-display area,
the edge area and the center area overlap the display area in a plan view,
the touch sense layer comprises a planarization layer and touch electrodes,
a thickness of the planarization layer is greater in the edge area than in the center area, and
the color filter comprises a first color filter, a second color filter, a third color filter, and color filter overlapped portions where the first color filter, the second color filter, and the third color filter are overlapped.

8. The OLED display of claim 7, wherein the color filter overlapped portions overlap areas where the partition layer is disposed in a plan view.

9. The OLED display of claim 8, wherein the first color filter, the second color filter, and the third color filter are respectively a red color filter, a green color filter, and a blue color filter.

10. The OLED display of claim 9, wherein the organic light emitting diode comprises an organic emission layer, and
a difference between a distance from a top surface of the organic emission layer to a topmost portion of the overlapped portion of the color filter in the center area and a distance from the top surface of the organic emission layer to the topmost portion of the overlapped portion of the color filter in the edge area is less than 7% of the distance from the top surface of the organic emission layer to the topmost portion of the overlapped portion of the color filter in the center area.

11. The OLED display of claim 10, wherein the touch sense layer further comprises an inorganic insulation layer,
the touch electrodes comprise a first touch electrode and a second touch electrode, and
the first touch electrode and second touch electrode each comprise a plurality of unit electrode lines.

12. The OLED display of claim 11, wherein the first touch electrode comprises a plurality of first touch cells arranged along a first direction and a plurality of first connection portions that connect the plurality of first touch cells, and
the second touch electrode comprises a plurality of second touch cells arranged along a second direction that crosses the first direction and second connection portions that connect the second touch cells.

13. The OLED display of claim 12, wherein the first connection portions are disposed on the encapsulation layer,
the planarization layer and the inorganic insulation layer are sequentially disposed on the first connection portion,
the first touch cells, the second touch cells, and the second connection portions are disposed on the inorganic insulation layer, and
the first touch cells are also disposed in openings that are formed in the planarization layer and the inorganic insulation layer such that they are connected with the first connection portions.

14. The OLED display of claim 13, wherein the first touch electrode receives a first touch signal for sensing a coordinate value in the second direction, and the second touch electrode receives a second touch signal for sensing a coordinate value in the first direction.

15. The OLED display of claim 14, wherein the planarization layer comprises an organic material, and the inorganic insulation layer comprises a silicon nitride (SiNx) or a silicon oxide ($SiO_x$).

16. The OLED display of claim 15, wherein a thickness of the encapsulation layer is greater in the center area than in the edge area.

17. The OLED display of claim 10, wherein the touch sense layer further comprises:
an inorganic insulation layer that is disposed on the planarization layer; and
wires that are connected with the touch electrodes,
wherein the touch electrodes are disposed on the inorganic insulation layer, and
the touch electrodes comprise a plurality of unit electrode lines.

18. The OLED display of claim 17, wherein the planarization layer comprises an organic material, and
the inorganic insulation layer comprises a silicon nitride (SiNx) or a silicon oxide ($SiO_x$).

19. An organic light emitting diode (OLED) display comprising:
a substrate that includes a display area and a non-display area;

a pixel circuit that is disposed on the display area;
organic light emitting diodes that are disposed on the pixel circuit;
a partition layer having openings that correspond to the organic light emitting diodes;
an encapsulation layer that covers the pixel circuit, the organic light emitting diodes, and the partition layer; and
a color filter that is disposed on the encapsulation layer,
wherein the encapsulation layer comprises an edge area that is adjacent to the non-display area in the display area and a center area not directly adjacent to the non-display area,
the color filter comprises a first color filter, a second color filter, and a third color filter, and color filter overlapped portions where the first color filter, the second color filter, and the third color filter are overlapped,
the color filter overlapped portions overlap areas where the partition layer is disposed in a plan view, and
a difference between a distance from the substrate to a top surface of the color filter overlapped portion in the center area and a distance from the substrate to the top surface of the color filter overlapped portion in the edge area is less than 5% of the distance from the substrate to the top surface of the color filter overlapped portion in the center area.

20. The OLED display of claim 19, wherein a height of the top surface of the encapsulation layer in the center area is uniform, and is gradually lowered in the edge area.

\* \* \* \* \*